US006573198B2

(12) United States Patent
Boonstra et al.

(10) Patent No.: US 6,573,198 B2
(45) Date of Patent: Jun. 3, 2003

(54) EARTHQUAKE PROTECTION FOR SEMICONDUCTOR PROCESSING EQUIPMENT

(75) Inventors: Klaas Peter Boonstra, Hilversum (NL); Christianus Gerardus Maria de Ridder, Hoogland (NL)

(73) Assignee: ASM International N.V. (NL)

( * ) Notice: Subject to any disclaimer, the term of this patent is extended or adjusted under 35 U.S.C. 154(b) by 0 days.

(21) Appl. No.: 09/975,025

(22) Filed: Oct. 10, 2001

(65) Prior Publication Data

US 2003/0068219 A1 Apr. 10, 2003

(51) Int. Cl.[7] .......................... H01L 21/00; B65G 49/07
(52) U.S. Cl. ..................... 438/795; 211/41.18; 414/940
(58) Field of Search ................... 438/800, 795, 438/799; 118/715, 724, 728, 729, 730, 500; 206/710, 711, 712; 211/41.18; 414/DIG. 935, DIG. 940

(56) References Cited

U.S. PATENT DOCUMENTS

| 5,178,639 A | 1/1993 | Nishi | 29/25.02 |
| 5,217,560 A * | 6/1993 | Kurono et al. | 118/723 R |
| 5,254,170 A | 10/1993 | Devilbiss et al. | 118/719 |
| 5,407,449 A | 4/1995 | Zinger | 29/25.01 |
| 5,464,313 A | 11/1995 | Ohsawa | 414/172 |
| 6,134,850 A | 10/2000 | Hui et al. | 52/167.1 |
| 6,352,593 B1 * | 3/2002 | Brors et al. | 118/641 |

FOREIGN PATENT DOCUMENTS

WO    WO/99/38199    7/1999    ........... H01L/21/00

* cited by examiner

*Primary Examiner*—Evan Pert
(74) *Attorney, Agent, or Firm*—Knobbe, Martens, Olson & Bear, LLP

(57) ABSTRACT

A wafer processing apparatus is provided with a wafer carrier comprising a doorplate, a pedestal including one or more legs to support the pedestal on the doorplate, and a wafer rack positionable on the pedestal. A pedestal lock is connected to the doorplate and is selectively engageable with at least one of the legs to lock the pedestal to the doorplate. A lock is further provided to selectively engage at least one of the wafer rack and the pedestal to lock the wafer rack to the pedestal. The pedestal is thereby prevented from falling off of the doorplate, and the wafer rack is prevented from falling off of the pedestal, during earthquake-induced vibrations and accelerations.

20 Claims, 9 Drawing Sheets

US 6,573,198 B2

EARTHQUAKE PROTECTION FOR SEMICONDUCTOR PROCESSING EQUIPMENT

BACKGROUND OF THE INVENTION

1. Field of the Invention

The present invention relates generally to semiconductor processing equipment and more particularly to earthquake protection for such equipment.

2. Description of the Related Art

Semiconductor workpieces, or wafers, are typically loaded into wafer racks or boats for processing in a batch reactor. If the reactor is a vertical reactor, the wafer rack is typically supported on a pedestal. In the system disclosed in PCT Publication No. WO 99/38199, published Jul. 29, 1999, the pedestal, in turn, is supported on a doorplate. The wafer rack and pedestal are lifted into the reactor from below. The doorplate serves to seal the internal chamber of the reactor from a surrounding processing chamber during processing of the wafers.

The wafer carrier and pedestal are typically made of quartz, and are relatively fragile. As such, they are susceptible to damage caused by earthquakes. During an earthquake, the wafer rack has a tendency to vibrate or rock back and forth on the pedestal. Similarly, the pedestal has a tendency to vibrate or rock back and forth on the doorplate. If the vibration or rocking caused by the earthquake is significant, the wafer rack can fall off of the pedestal, and the pedestal can fall off of the doorplate. As a result, damage to the wafer rack, pedestal, wafers, and the reactor or surrounding processing chamber can occur. The loss of an entire rack of large wafers (e.g., 100) can be quite expensive.

Accordingly, a need exists for semiconductor processing equipment that is equipped to prevent damage that can be caused by earthquakes.

SUMMARY OF THE INVENTION

In accordance with one aspect of the present invention, a wafer carrier is provided comprising a wafer rack adapted to receive a plurality of wafers and a pedestal supporting the wafer rack. A lock is provided that is engageable with at least one of the wafer rack and the pedestal to selectively lock the wafer rack to the pedestal. The wafer rack is thus prevented from falling off of the pedestal as a result of earthquake-induced vibrations and accelerations.

In accordance with another aspect of the present invention, a wafer processing apparatus is provided, comprising a doorplate, a pedestal including one or more legs to support the pedestal on the doorplate, and a wafer rack positionable on the pedestal. A pedestal lock is connected to the doorplate and is selectively engageable with at least one of the legs to lock the pedestal to the doorplate. The pedestal is thereby prevented from falling off of the doorplate as a result of earthquake-induced vibrations and accelerations.

DETAILED DESCRIPTION OF THE PREFERRED EMBODIMENT

Figure 1:
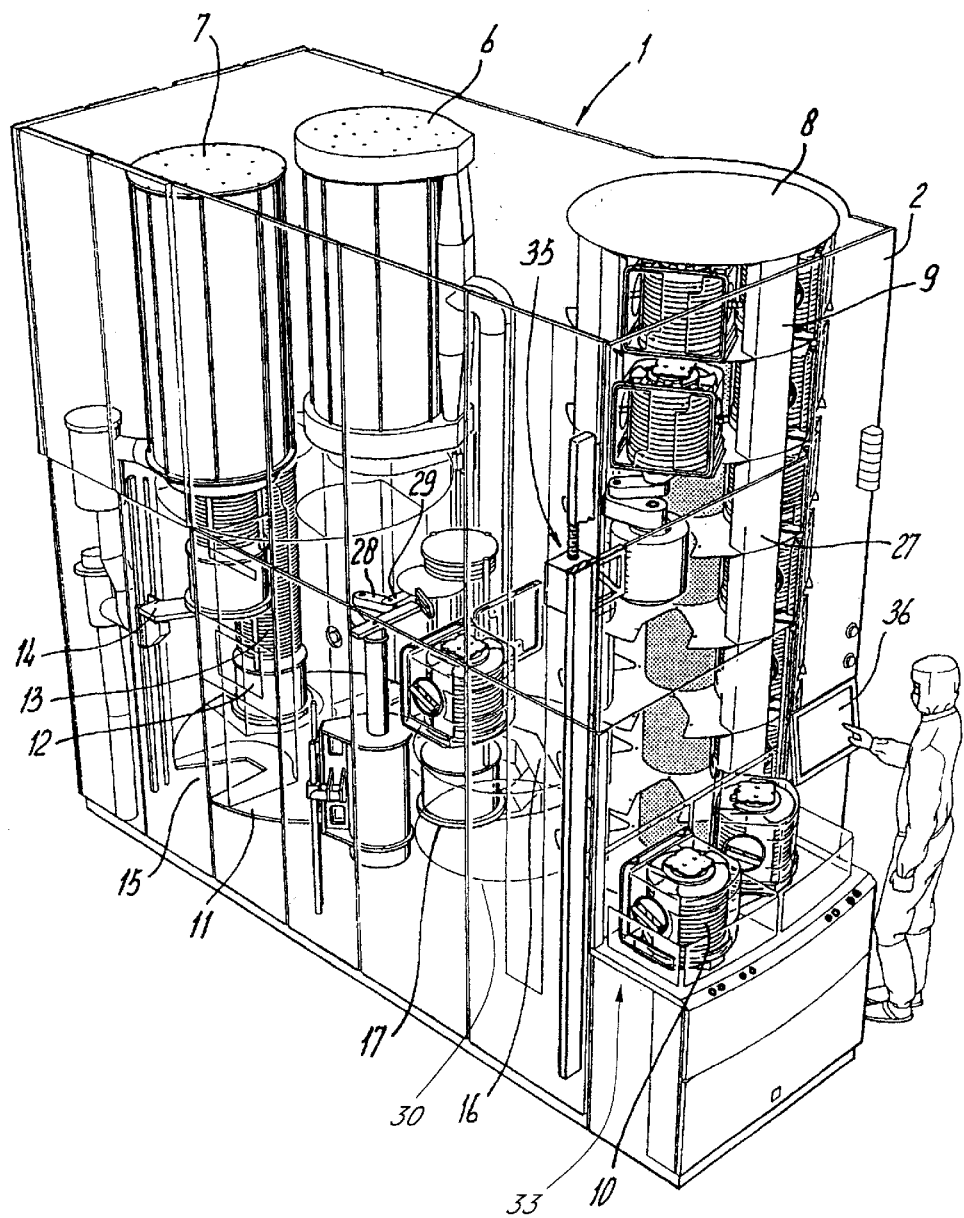
FIG. 1 is a perspective view of an exemplary wafer processing system in accordance with the prior art.
Figure 2:
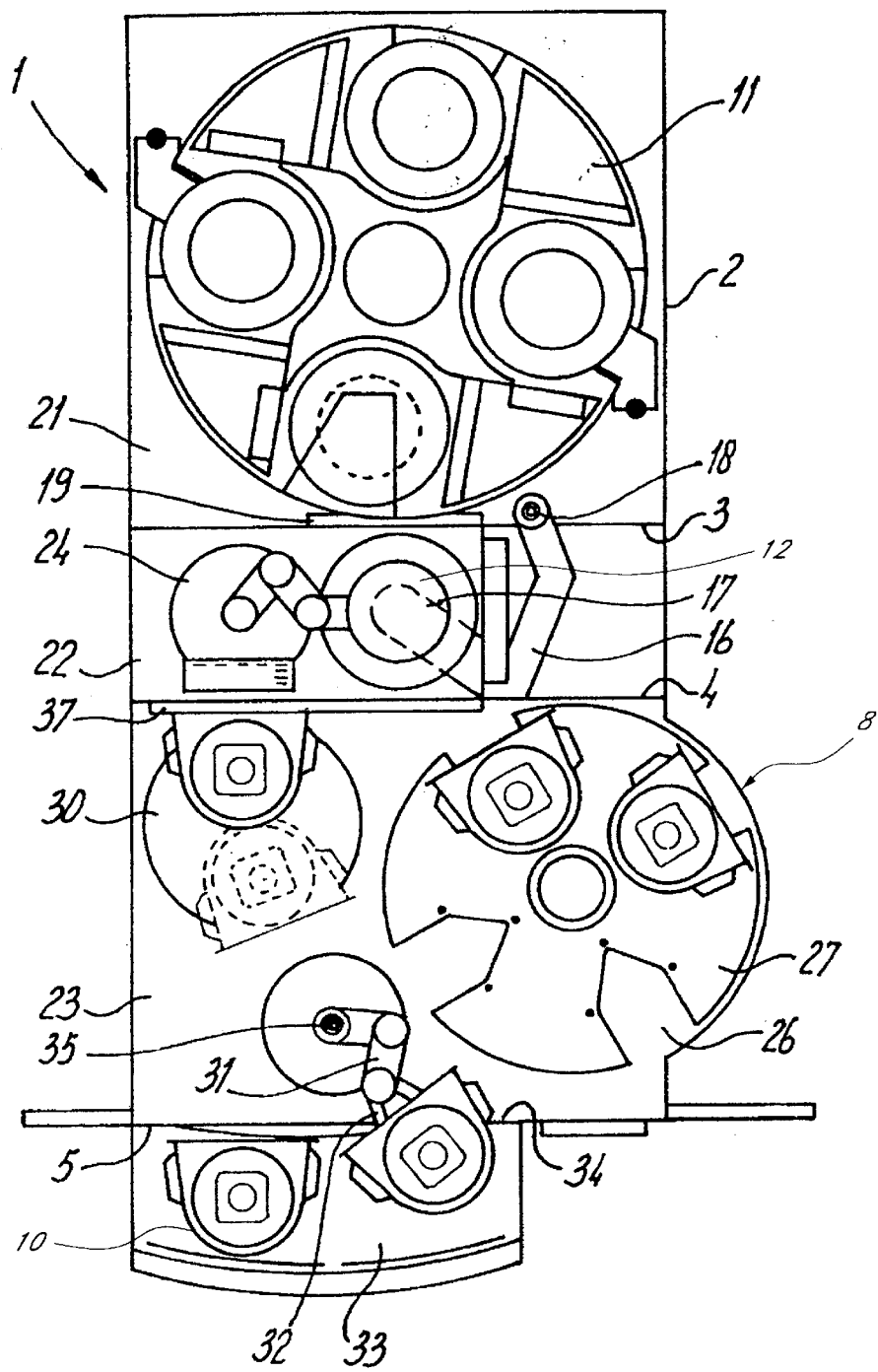
FIG. 2 is a schematic plan view of the system of FIG. 1.

With reference to FIGS. 1 and 2, an exemplary wafer processing apparatus is illustrated and indicated generally by the reference numeral 1. The exemplary apparatus 1 of FIGS. 1 and 2 comprises a housing 2 and is generally installed in a so-called "clean room." In addition to the housing 2, partitions 3, 4 and 5 are also present. The housing 2 delimits, with the partition 3, a processing area or chamber 21. In this example, the processing area 21 comprises vertical furnaces 6, 7. The housing 2 and the partitions 3 and 4 define a wafer handling chamber 22. A cassette transfer chamber 23 is defined between the housing 2 and partitions 4 and 5. An input/output station, to transfer cassettes into and out of the system 1, is indicated by reference numeral 33.

Wafers 13 are supplied in cassettes 10, which are placed on the input/output station 33. A cassette handling device 31 transfers the cassettes 10 from the input/output station 33 through a closable opening 34 into a cassette store 8 located in the cassette transfer chamber 23. The cassette store 8 is provided with a number of vertically aligned rotary platforms 27 on which the cassettes 10 are stored. The cassette handling device 31 is movable in a vertical direction by means of an elevator 35 so that the different platforms 27 can be reached. The cassette handling device 31 is provided with a cassette end effector 32, which has dimensions a little smaller than those of a series cut-outs 26 in the rotary platforms 27. When the cassette handling device 31 has transferred a cassette into the store 8, an end effector 32 of the device 31 can be lowered through one of the cut-outs 26 in one of the platforms 27 to place the cassette on the platform 27. Subsequently, the cassette handler 31 can be retracted from the cassette store 8. The cassette handling device 31 is mounted such that it is able to transfer cassettes between the input/output station 33 and the store 8. The device 31 is also capable of transferring cassettes between the store 8 and a rotatable cassette transfer platform 30, or between the input/output station 33 and the rotatable cassette transfer platform 30.

The rotatable cassette transfer platform 30 is constructed such that, on rotation, the cassette is placed against the partition 4 between the cassette transfer chamber 23 and the wafer handling chamber 22. The partition 4 is provided with a closure and a closure mechanism, together forming an interface schematically indicated by the reference numeral 37. After placing the cassette against the interface 37 in the partition 4, the closure mechanism grips and unlocks the closure of the cassette and simultaneously opens the closure in the partition 4 and the closure of the cassette.

A wafer handling device 24 within the wafer handling chamber 22 transfers wafers between the cassette concerned and a wafer carrier 12. The wafer handling device 24 comprises a robot arm 28 with a wafer end effector 29, numbered in FIG. 1. As described below, each of the wafer carriers 12 preferably comprises a wafer boat or rack supported on a pedestal. A doorplate is preferably provided below each of the pedestals.

After completion of the loading of wafers into the wafer carrier 12, a transfer arm 16 swings about pivot point 18 and moves the wafer carrier 12 upon a support surface 17 through an openable closure 19 in the partition 3 from the wafer handling chamber 22 into the processing chamber 21. The processing chamber 21 is provided with a rotary transfer platform 11, supporting the wafer carrier 12. Two reactors, which in this case comprise furnaces 6, 7, are arranged in the processing chamber 21. The furnaces 6, 7 are positioned vertically and wafer carriers 12, filled with wafers 13, are introduced vertically into the furnaces 6, 7 from below. To this end, each furnace 6, 7 has an insertion arm 14, which is movable in the vertical direction and sized to fit through slots 15 in the transfer platform. The doorplates below the wafer racks serve to seal the reactors from the outside processing chamber when the wafer carriers 12 are lifted up into the reactors.

The treatment of a large number of wafers can be carried out as follows: The operator, shown diagrammatically in FIG. 1, loads the store 8 by introducing a number of cassettes 10 on the input/output station 33 and carrying out control operations on a control panel 36. Each of the cassettes 10 is transferred from the input/output station 33 with the aid of the cassette handling device 31 into the storage compartments 9 made for these cassettes in the store 8, specifically on the stacked rotary platforms 27. By rotation of the store 8 and use of the elevator 35, it is possible to fill various compartments with the cassettes 10. After filling the store 8, no further human interaction is required with this exemplary automated installation.

The cassettes 10 concerned are then removed from the store 8 by the cassette handler device 31 and placed on the cassette transfer platform 30. The cassette transfer platform 30 comprises two levels, schematically indicated in FIG. 1, each level capable of receiving a cassette, where the two levels can be rotated independently of one another. Upon rotation of the cassette transfer platform 30, the cassettes are placed against the partition 4. After opening of the closure of the cassette, together with the closure 37 in the partition 4, the wafers are removed by the wafer handler 24 and placed in a wafer carrier 12. After the wafer carrier 12 has been filled, and becomes available for one of the reactors 6,7, the closure 19 in partition 3 is opened and the wafer boat 12 is placed on the transfer platform 11 by the transfer arm 16. The transfer platform 11 then moves the wafer carrier 12 within the process chamber 21 to a position below the reactor to be loaded. Then the insertion mechanism or elevator 14 moves through the slot 15 in the transfer platform 11 to lift the carrier 12 into the reactor 6 or 7. Treated wafers move counter to the course described above after being lowered an cooled within the chamber 21.

Figure 4:
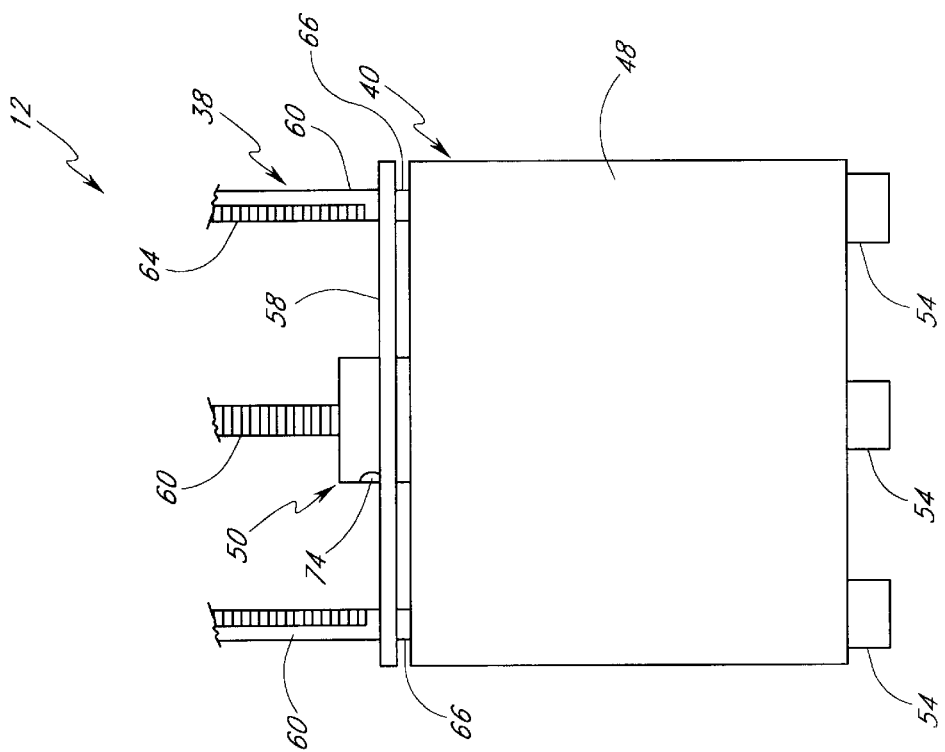
FIG. 4 is an elevational view of the pedestal and lower portion of the wafer rack of FIG. 3 in an assembled position.
Figure 3:
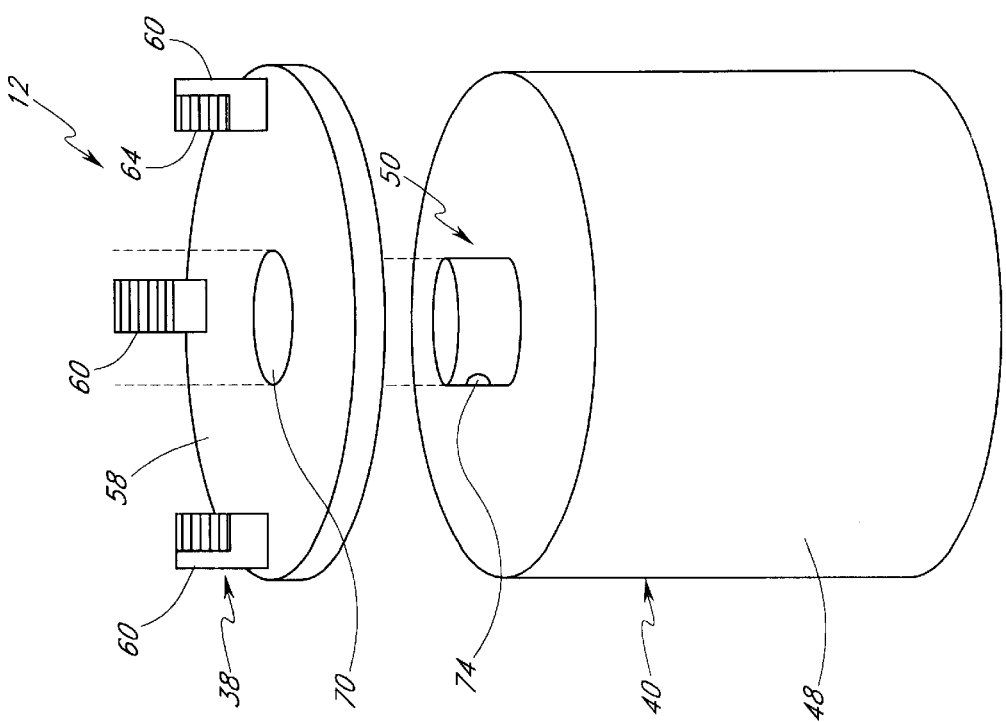
FIG. 3 is an isometric view of the pedestal and the lower portion of the wafer rack for a system similar to that of FIG. 1, constructed in accordance with a preferred embodiment of the present invention.

With reference now to FIGS. 3 and 4, a preferred embodiment of the wafer carrier 12 that can be used in the exemplary wafer processing apparatus 1 is illustrated. As noted above, the wafer carrier 12 comprises a wafer boat or rack 38 and a pedestal 40. In the illustrated embodiment, the pedestal 40 comprises a generally cylindrical main portion 48 and a generally cylindrical beam portion 50 that extends upwardly from a top surface of the main portion 48. A number of legs 54 extend below the main portion 48 to support the pedestal 40. In the illustrated embodiment, the pedestal 40 has four legs 54, one of which is hidden behind the middle leg 54 in FIG. 4.

The wafer rack 38 illustrated in FIGS. 3 and 4 comprises a generally disc-shaped base 58 and a number of columns 60 that extend upwardly from the base 58. In the illustrated embodiment, the wafer rack 38 includes three columns 60 that are spaced around a perimeter of the base 58. The columns 60 are provided with a number of slots 64 for supporting individual wafers in the wafer rack 38. Preferably, greater than 40 such slots 64 are provided and 100 slots are provided in the illustrated embodiment. A number of legs 66 extend below the base 58 to support the wafer rack 38 on the pedestal 40.

In the illustrated embodiment, an opening 70 is provided in the center of the base 58 of the wafer rack 38. When the wafer rack 38 is placed on top of the pedestal 40, the beam portion 50 of the pedestal 40 extends upwardly through the opening 70 in the base 58. Preferably, the diameter of the opening 70 is only slightly larger than the diameter of the beam portion 50 to help prevent lateral rocking of the wafer rack 38 on the pedestal 40.

Figure 5:
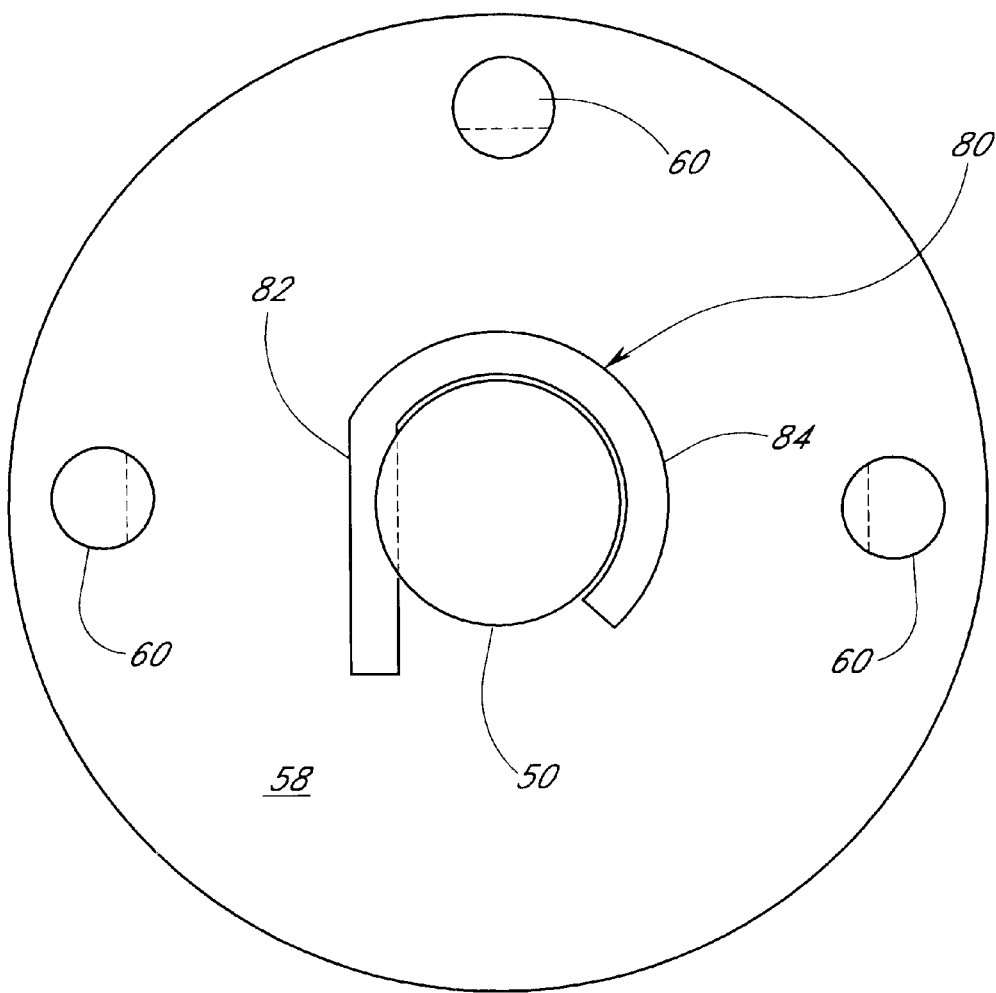
FIG. 5 is a top plan view of the pedestal and wafer rack of the system of FIG. 3, with a lock engaged with the beam of the pedestal.

As illustrated in FIGS. 3–5, a linear groove 74 is formed in a side of the beam portion 50 of the pedestal 40. Preferably, the groove 74 is located a distance above the top surface of the main portion 48 such that, when the wafer rack 38 is situated on top of the pedestal 40, the groove 74 is located just above a top surface of the base 58 of the wafer rack 38, as best seen in the view of FIG. 4.

The wafer carrier 12 desirably also comprises a lock 80 (FIG. 5) for locking the wafer rack 38 to the pedestal 40. In the illustrated embodiment, the lock 80 comprises a generally linear segment 82 and a curved segment 84 that extends from one end of the linear segment 82 towards the other end. Preferably, the lock 80 extends greater than 180 degrees around the beam portion 50 of the pedestal 40.

Figure 6:
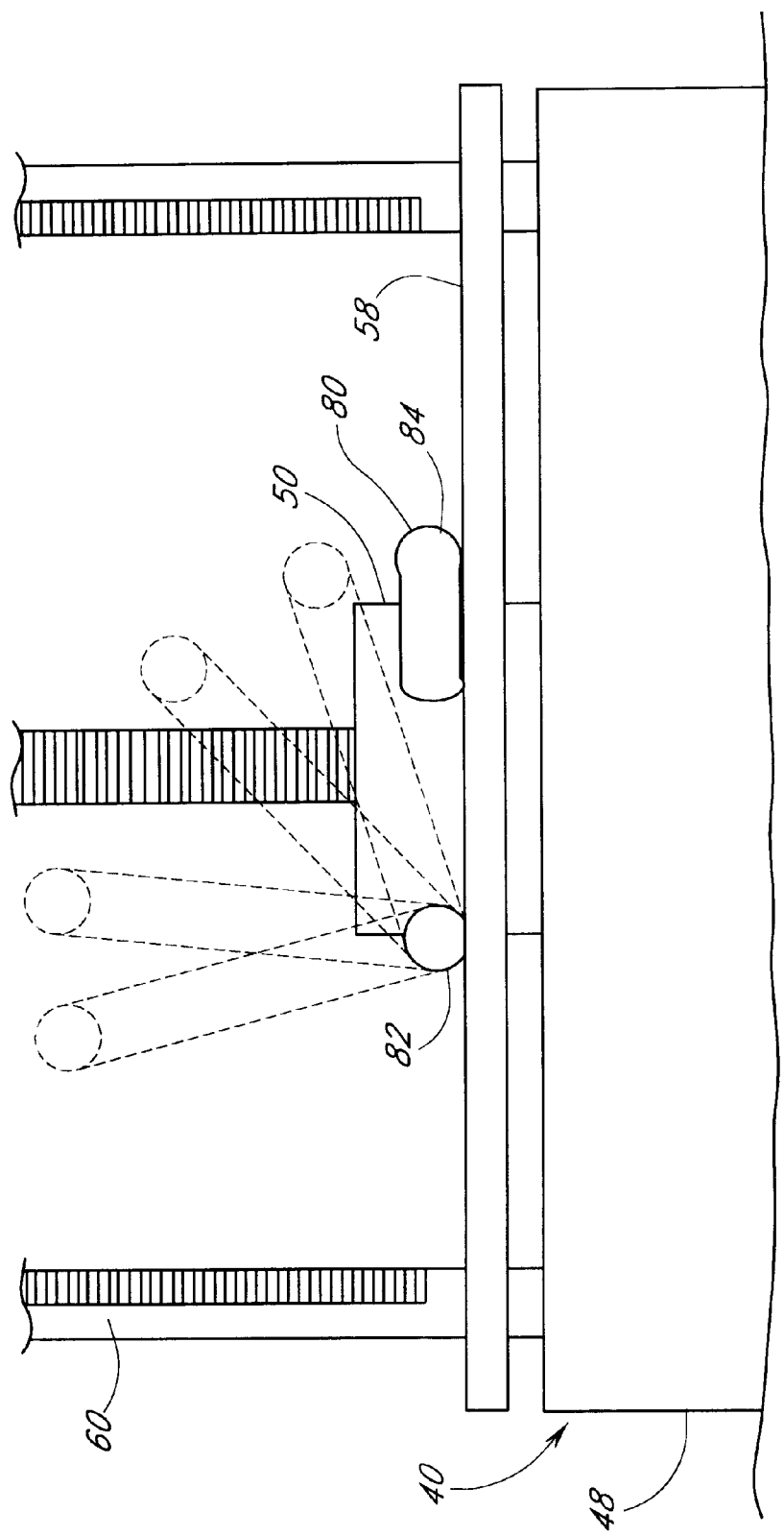
FIG. 6 is a side elevational view of the pedestal, wafer rack and lock of FIG. 5, illustrating the operation of the lock.

To engage the lock 80, the linear segment 82 is placed in the groove 74 of the beam portion 50. The lock 80 is initially oriented vertically so that the curved segment 84 extends above the linear segment 82. The curved segment 84 is then rotated over the top of the beam portion 50, as illustrated in FIG. 6, until the curved segment 84 rests against the top surface of the base 58. The curved segment 84 extends partially around the beam portion 50 of the pedestal 40, preferably greater than 180 degrees around, to prevent the linear segment 82 of the lock 80 from sliding out of the groove 74. To disengage the lock 80, the curved segment 84 is lifted off of the base 58 and rotated back over the top of the beam portion 50. The linear segment 82 can then be removed from the groove 74.

When engaged, the lock 80 prevents movement of the wafer rack 38 relative to the pedestal 40. The linear portion 82 of the lock 80 is trapped in the groove 74 in the beam portion 50 of the pedestal 40. When the wafer rack 38 is moved upwardly away from the pedestal 40, the linear segment 82 of the lock 80 abuts the top surface of the base 58 of the wafer rack 38, preventing further movement of the wafer rack 38 relative to the pedestal 40.

Like the rest of the wafer carrier 12, the lock 80 is preferably formed of a material that is process-compatible (i.e., non-contaminating) and capable of withstanding the high temperatures (e.g., greater than about 400° C.) to which the wafer carrier 12 is exposed during processing. Preferably, the lock is formed of quartz or silicon carbide (SiC).

Figure 7:
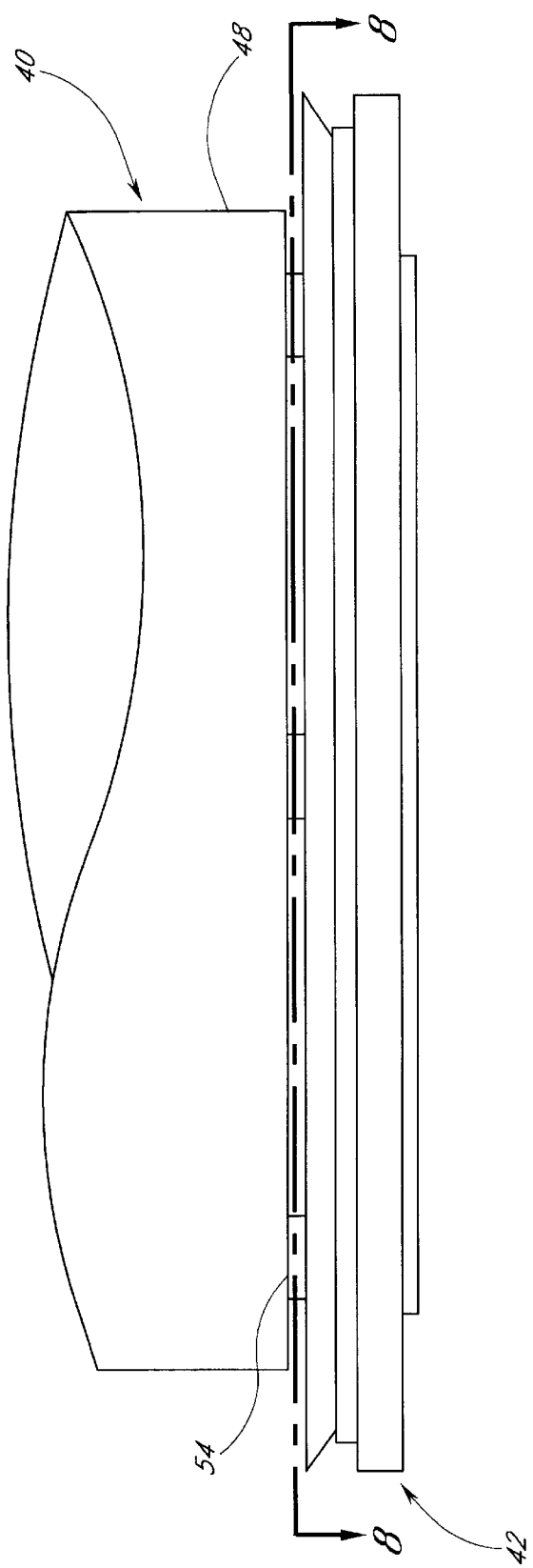
FIG. 7 is an elevational view of the lower portion of the pedestal of FIG. 5 and an underlying doorplate.

With reference now to FIG. 7, a doorplate 42 and lower portion of the pedestal 40 are shown. The main portion 48 of the pedestal 40 is supported above the doorplate 42 by the pedestal legs 54.

Figure 8:
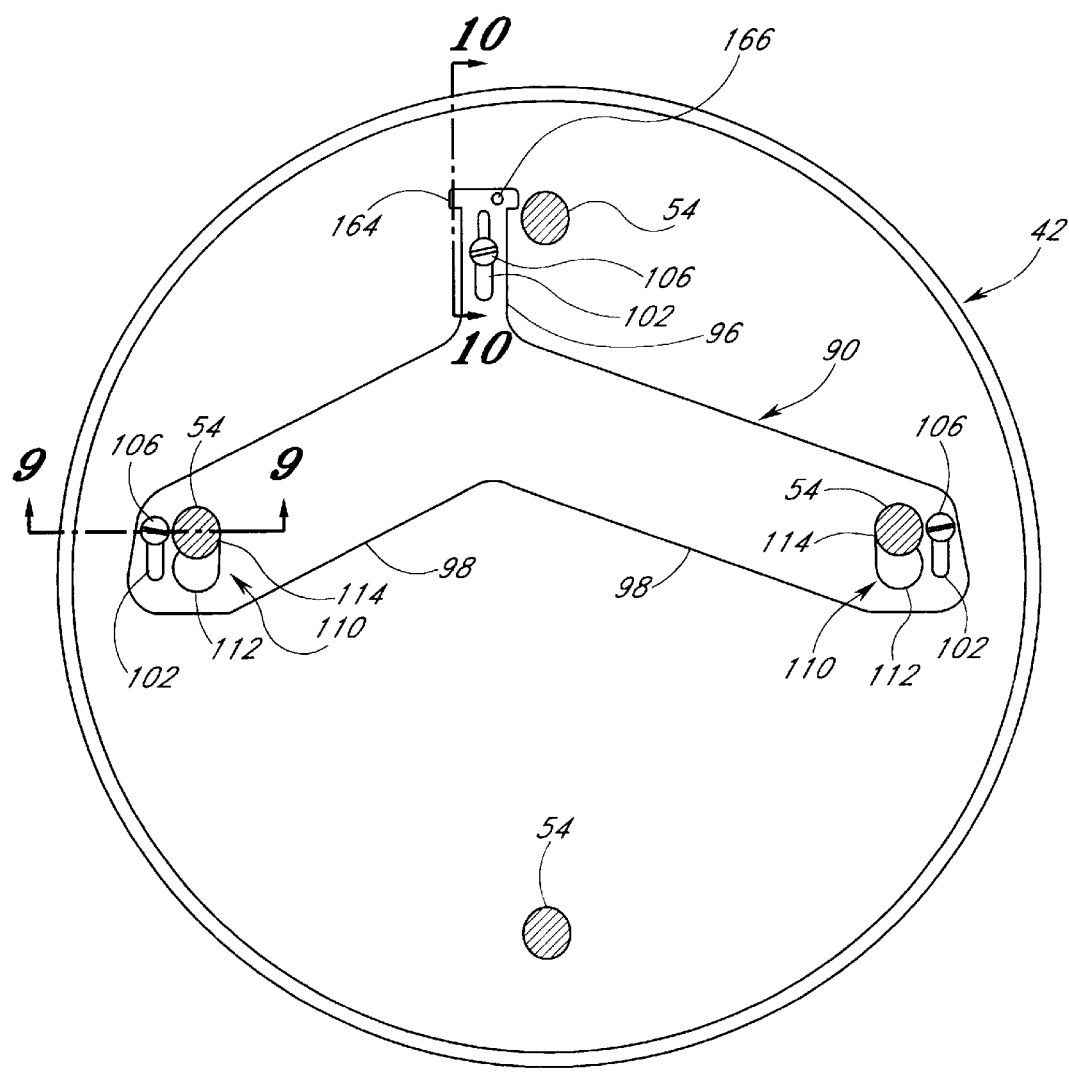
FIG. 8 is a cross-sectional view taken through the legs of the pedestal along lines 8—8 in FIG. 7.

FIG. 8 is a cross-sectional view taken through the pedestal legs 54 along lines 8—8 in FIG. 7. As illustrated in FIG. 8, a pedestal lock 90 is provided between the doorplate 42 and the main portion 48 of the pedestal 40. In the illustrated embodiment, the pedestal lock 90 is generally Y-shaped and comprises a stem 96 and a pair of arms 98 that extend outwardly from the stem 96. A slotted opening 102 is provided in the stem 96 and in each of the arms 98. A screw 106 extends through each of the slotted openings 102 and into the doorplate 42 to slidably secure the pedestal lock 90 to the door plate 42.

Referring still to FIG. 8, in the illustrated embodiment, a second opening 110 is provided in each of the lock arms 98 inwardly of the slotted openings 102. Each of the second openings 110 comprises a circular portion 112 and a slotted portion 114 that extends from the circular portion 112, preferably parallel to the slots 102. The circular portions 112 of the openings 110 preferably have a diameter that is slightly larger than a diameter of the pedestal legs 54. The slotted portions 114 of the openings 110 preferably have a more narrow lateral width that is slightly less than the diameter of the pedestal legs 54.

Figure 9:
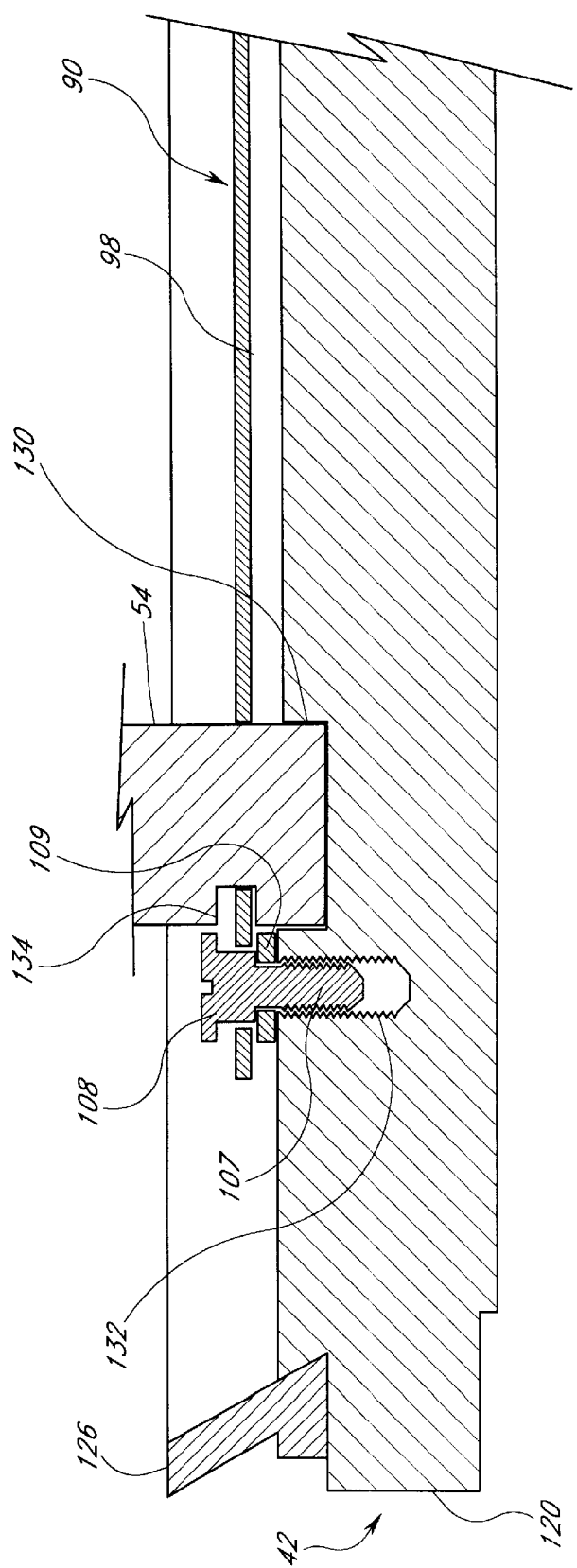
FIG. 9 is a cross-sectional view taken through the pedestal lock, pedestal leg, screw and doorplate of the system of FIG. 1 along lines 9—9 in FIG. 8.

FIG. 9 is a cross-sectional view taken through the pedestal lock 90, pedestal leg 54, screw 106 and doorplate 42 along lines 9—9 in FIG. 8. As illustrated in FIG. 9, the doorplate 42 of the illustrated embodiment comprises a main plate 120 and a lip seal 126 extending upwardly and outwardly from the main plate 120 around a circumference of the main plate 120. The main plate 120 desirably is provided with blind holes 130 that extend from the upper surface of main plate 120 in a direction perpendicular to the upper surface, the locations of which correspond to the locations of the legs 54 of the pedestal 40. When the pedestal 40 is situated on top of the doorplate 42, the pedestal legs 54 extend into the holes 130 in the main plate 120.

Preferably, the screws 106 are provided with a lower threaded portion 107 and an upper portion 108 having a larger diameter than the threaded portion 107. The main plate 120 is provided with threaded blind holes 132 extending from the upper surface of main plate 120 in a direction perpendicular to the upper surface and are designed to receive and mate with the lower threaded portion 107 of the screws 106. The length of the upper portion 108 of the screws 106 is preferably slightly greater than the thickness of the pedestal lock 90. A separate washer 109 is provided below the pedestal lock 90. The screws 106 can be tightened against the door plate 42 to slidably secure the pedestal lock 90 to the doorplate 42 and allow the pedestal lock 90 to move a predetermined distance in the vertical direction between the washers 109 and the screw 106 heads.

Figure 10:
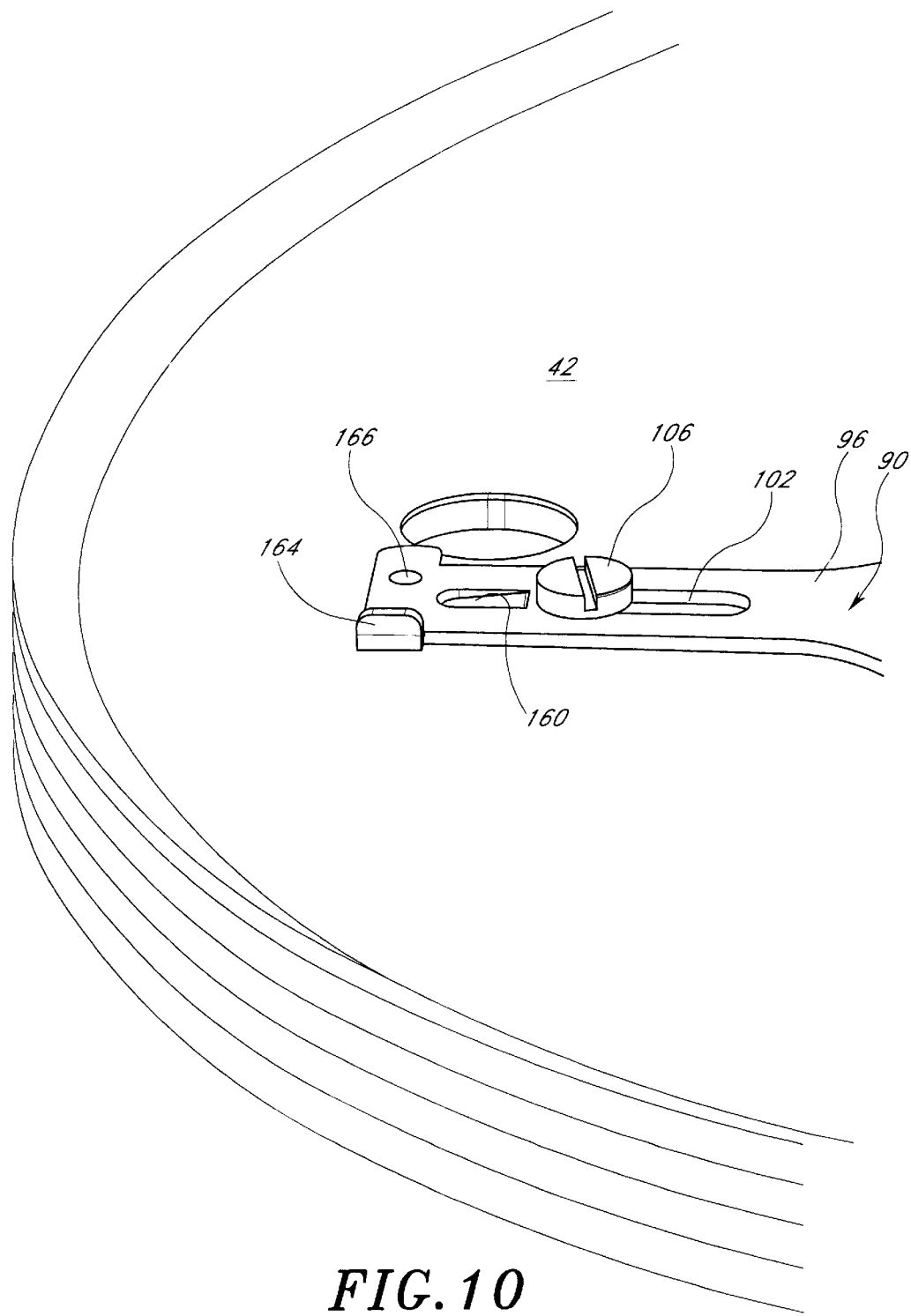
FIG. 10 is a perspective view of the pedestal lock and door plate.

Referring still to FIG. 9, the pedestal legs 54 desirably each have a notch 134 formed in a side thereof. To engage the pedestal lock 90, the lock 90 is slid relative to the pedestal 40 and doorplate 42 so that the legs 54 of the pedestal 40 extend through the slotted portions 114 of the lock arm openings 110, as illustrated in FIGS. 8–10. Since the lateral width of the slotted portions 114 of the openings 110 is less than the diameter of the legs 54, the lock arms 98 extend into the notches 134 to trap the legs 54, thereby locking the pedestal 40 to the doorplate 40.

To disengage the pedestal lock 90, the lock 90 is slid relative to the pedestal 40 and doorplate 42 so that the legs 54 of the pedestal 40 extend through the circular portions 112 of the lock arm openings 110. Since the diameter of the circular portions 112 of the openings 110 is larger than the diameter of the pedestal legs 54, the legs 54 are freed from the lock arms 98 and the pedestal 40 can thus be lifted off of the doorplate 42.

FIG. 10 is a perspective view of the door plate 42 and the pedestal lock 90. A tab 160 is punched in the pedestal lock 90 near an end of the slotted opening 102 in the stem 96. The tab 160 is bent downwardly towards the doorplate 42. A slot (not shown) is provided in the doorplate 42 below the tab 160 so that, when the pedestal lock 90 is in the locked position, the tab 160 extends into and is retained in the slot to prevent the pedestal lock 90 from sliding to the unlocked position. An upwardly extending tab 164 and an opening 166 preferably are provided at an end of the stem 96. The upwardly extending tab 164 and opening 166 are intended to cooperate with a locking tool (not shown) to facilitate movement of the lock 90 between the locked and unlocked positions.

The wafer carrier 12 of the preferred embodiments can be manufactured with tooling similar to that used for manufacturing conventional wafer carriers, thereby minimizing retooling costs. The wafer carrier 12 can be incorporated in a variety of different processing systems. The processing apparatus 1 illustrated in FIGS. 1 and 2 is merely exemplary. The wafer carrier 12 of the preferred embodiments, however, is especially advantageous in processing systems such as that of FIGS. 1 and 2, in which the wafer carriers are transported within the housing 2.

Although the invention has been disclosed in the context of certain preferred embodiments and examples, it will be understood by those skilled in the art that the present invention extends beyond the specifically disclosed embodiments to other alternative embodiments and/or uses of the invention and obvious modifications and equivalents thereof. Thus, it is intended that the scope of the present invention herein disclosed should not be limited by the particular disclosed embodiments described above, but should be determined only by a fair reading of the claims that follow.

We claim:

1. A wafer carrier, comprising:
    a wafer rack adapted to receive a plurality of wafers, said wafer rack comprising a base having an opening therein;
    a pedestal supporting said wafer rack, said pedestal comprising a main portion and a protrusion extending from said main portion, said protrusion extending through said opening in said base and having a portion extending above said base when said wafer rack is situated on said pedestal; and
    a lock engageable with the portion of said protrusion extending above said base to selectively lock said wafer carrier to said pedestal.

2. A wafer carrier, comprising:
    a wafer rack adapted to receive a plurality of wafers, said wafer rack comprising a base having an opening therein;
    a pedestal supporting said wafer rack, said pedestal comprising a main portion and a protrusion extending from said main portion, said protrusion extending through said opening in said base when said wafer rack is situated on said pedestal; and
    a lock engageable with said protrusion to selectively lock said wafer carrier to said pedestal, wherein a groove is formed in said protrusion of said pedestal and said lock is selectively engageable in said groove to lock said wafer carrier to said pedestal.

3. The wafer carrier of claim 2, wherein said lock comprises a generally linear segment and a curved segment extending from an end of said linear segment, said linear segment being engageable in said groove and said curved segment being rotatable over an end of said protrusion when said linear segment is engaged in said groove to prevent said linear segment from sliding out of said groove.

4. The wafer carrier of claim 3, wherein said protrusion is generally cylindrical.

5. The wafer carrier of claim 4, wherein said curved segment extends greater than 180 degrees around said protrusion.

6. The wafer carrier of claim 1, wherein said lock comprises quartz.

7. The wafer carrier of claim 1, further comprising a doorplate and a pedestal lock, wherein said pedestal comprises one or more legs to support said pedestal on said doorplate, and wherein said pedestal lock is movably connected to said doorplate and selectively engageable with at least one of said legs to lock said pedestal to said doorplate.

8. A wafer carrier, comprising:
a wafer rack adapted to receive a plurality of wafers, said wafer rack comprising a base having an opening therein;
a pedestal supporting said wafer rack, said pedestal comprising a main portion and a protrusion extending from said main portion, said protrusion extending through said opening in said base when said wafer rack is situated on said pedestal;
a lock engageable with said protrusion to selectively lock said wafer carrier to said pedestal; and
a doorplate and a pedestal lock, wherein said pedestal comprises one or more legs to support said pedestal on said doorplate, and wherein said pedestal lock is movably connected to said doorplate and selectively engageable with at least one of said legs to lock said pedestal to said doorplate, wherein a notch is provided in said at least one leg and said pedestal lock is slideable relative to said doorplate to selectively engage said pedestal lock in said notch.

9. The wafer carrier of claim 8, wherein at least one opening is provided in said pedestal lock, said opening comprising a larger portion and a smaller slotted portion extending from said larger portion, said pedestal lock being slideable relative to said doorplate between a first position wherein said at least one leg extends through said larger portion of said opening, and a second position wherein said leg extends through said slotted portion of said opening, said pedestal lock being engaged in said notch when said lock is in said second position.

10. The wafer carrier of claim 9, wherein said pedestal lock comprises a tab that extends towards said doorplate, and wherein a slot is formed in a surface of said doorplate, said tab extending into said slot when said pedestal lock is in said second position to prevent the unintended sliding of said lock to said first position.

11. A wafer carrier, comprising:
a wafer rack having an interior adapted to receive a plurality of wafers;
a pedestal supporting said wafer rack; and
a lock engageable with at least one of said wafer rack and said pedestal to selectively lock said wafer rack to said pedestal, wherein said lock comprises an element adapted to removably engage with a portion of the pedestal protruding into the interior of the wafer rack.

12. The wafer carrier of claim 11, further comprising a doorplate and a pedestal lock, wherein said pedestal comprises one or more legs to support said pedestal on said doorplate and said pedestal lock is movably connected to said doorplate and selectively engageable with at least one of said legs to lock said pedestal to said doorplate.

13. A wafer carrier, comprising:
a wafer rack adapted to receive a plurality of wafers;
a pedestal supporting said wafer rack;
a lock engageable with at least one of said wafer rack and said pedestal to selectively lock said wafer rack to said pedestal;
a doorplate; and
a pedestal lock,
wherein said pedestal comprises one or more legs to support said pedestal on said doorplate and said pedestal lock is movably connected to said doorplate and selectively engageable with at least one of said legs to lock said pedestal to said doorplate,
wherein at least one opening is provided in said pedestal lock, said opening comprising a larger portion and a smaller slotted portion extending from said larger portion, said pedestal lock being slideable relative to said doorplate between a first position wherein said at least one leg extends through said larger portion of said opening, and a second position wherein said leg extends through said slotted portion of said opening, said pedestal lock being engaged in said notch when said pedestal lock is in said second position.

14. The wafer carrier of claim 13, wherein said pedestal lock comprises a tab that extends towards said doorplate, and wherein a slot is formed in a surface of said doorplate, said tab extending into said slot when said pedestal lock is in said second position to prevent the unintended sliding of said lock to said first position.

15. A method of processing wafers in a vertical reactor, comprising the steps of:
placing a pedestal on top of a doorplate;
placing a wafer rack on top of said pedestal;
locking said pedestal to said doorplate by engaging a locking element to a portion of the pedestal protruding into an interior portion of said wafer rack to prevent vertical movement of said pedestal relative to said doorplate;
locking said wafer rack to said pedestal to prevent vertical movement of said wafer rack relative to said pedestal;
loading a plurality of wafers into said wafer rack;
raising said wafer rack supported on said doorplate and pedestal into a reactor; and
processing said wafers in said reactor.

16. A method of processing wafers in a vertical reactor, comprising the steps of:
placing a pedestal on top of a doorplate;
placing a wafer rack on top of said pedestal;
locking said pedestal to said doorplate to prevent vertical movement of said pedestal relative to said doorplate;
locking said wafer rack to said pedestal to prevent vertical movement of said wafer rack relative to said pedestal;
loading a plurality of wafers into said wafer rack;
raising said wafer rack supported on said doorplate and pedestal into a reactor; and processing said wafers in said reactor, wherein said wafer rack comprises a base having an opening therein, and said pedestal comprises a main portion and a protrusion, said protrusion extending into said opening when said wafer rack is situated on said pedestal, and wherein said locking of said wafer rack to said pedestal comprises engaging a first segment of a lock in a groove formed in said protrusion and rotating a second segment of said lock over an end of said protrusion to prevent said first segment from sliding out of said groove.

17. A method of processing wafers in a vertical reactor, comprising the steps of:

placing a pedestal on top of a doorplate;

placing a wafer rack on top of said pedestal;

locking said pedestal to said doorplate to prevent vertical movement of said pedestal relative to said doorplate;

locking said wafer rack to said pedestal to prevent vertical movement of said wafer rack relative to said pedestal;

loading a plurality of wafers into said wafer rack;

raising said wafer rack supported on said doorplate and pedestal into a reactor; and processing said wafers in said reactor, wherein said pedestal comprises one or more legs to support said pedestal on said doorplate, and a pedestal lock is slideably connected to said doorplate, and wherein said locking of said pedestal to said doorplate comprises sliding said lock relative to said doorplate to engage said lock in a notch formed in at least on of said legs.

18. The method of claim 15, wherein said loading of said wafer rack is performed outside of a processing chamber within which said reactor is located.

19. The method of claim 18, further comprising moving said wafer rack into said processing chamber after said loading of said wafer rack.

20. The method of claim 19, further comprising rotating said wafer rack on a turntable prior to raising said wafer rack into said reactor.

* * * * *